(12) United States Patent
Park et al.

(10) Patent No.: US 9,336,945 B2
(45) Date of Patent: May 10, 2016

(54) MULTILAYER CERAMIC CAPACITOR

(71) Applicant: SAMSUNG ELECTRO-MECHANICS CO., LTD., Suwon, Gyunggi-do (KR)

(72) Inventors: Min Cheol Park, Gyunggi-do (KR); Heung Kil Park, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 147 days.

(21) Appl. No.: 14/188,044

(22) Filed: Feb. 24, 2014

(65) Prior Publication Data

US 2015/0114700 A1  Apr. 30, 2015

(30) Foreign Application Priority Data

Oct. 28, 2013  (KR) .................. 10-2013-0128631

(51) Int. Cl.
| | |
|---|---|
| *H01G 4/012* | (2006.01) |
| *H01G 4/30* | (2006.01) |
| *H05K 1/18* | (2006.01) |
| *H01G 2/06* | (2006.01) |
| *H01G 4/232* | (2006.01) |
| *H05K 3/34* | (2006.01) |

(52) U.S. Cl.
CPC ............ *H01G 4/012* (2013.01); *H01G 2/065* (2013.01); *H01G 4/232* (2013.01); *H01G 4/30* (2013.01); *H05K 3/3442* (2013.01); *H05K 2201/10015* (2013.01)

(58) Field of Classification Search
CPC ......... H01G 4/012; H01G 4/30; H05K 1/181; H05K 2201/10015
USPC ............................. 174/260; 361/301.4, 321.1
See application file for complete search history.

(56) References Cited

U.S. PATENT DOCUMENTS

| | | | |
|---|---|---|---|
| 2010/0290172 A1* | 11/2010 | Motoki .................. | H01G 4/232 361/305 |
| 2012/0019100 A1* | 1/2012 | Iwanaga ................. | H01G 4/012 310/311 |
| 2012/0314338 A1* | 12/2012 | Togashi ................... | H01G 4/30 361/306.3 |

(Continued)

FOREIGN PATENT DOCUMENTS

| CN | 101246777 A | * | 8/2008 |
|---|---|---|---|
| JP | 10-289837 A | | 10/1998 |

(Continued)

OTHER PUBLICATIONS

Korean Office Action issued in Korean Application No. 10-2013-0020383 dated May 23, 2014.

*Primary Examiner* — Timothy Thompson
*Assistant Examiner* — Charles Pizzuto
(74) *Attorney, Agent, or Firm* — McDermott Will & Emery LLP

(57) ABSTRACT

There is provided a multilayer ceramic capacitor including: a ceramic body having a plurality of dielectric layers stacked in a width direction; a plurality of first and second internal electrodes disposed in the ceramic body to be alternately exposed to the first and second end surfaces of the ceramic body, respectively, with the dielectric layers interposed therebetween; a plurality of first dummy electrodes; a plurality of second dummy electrodes; first and second external electrodes; first and second plating layers; and first and second terminal electrodes.

32 Claims, 8 Drawing Sheets

(56) References Cited

U.S. PATENT DOCUMENTS

2014/0016248 A1* 1/2014 Machida .............. H01G 9/0036 361/528
2014/0144687 A1* 5/2014 Ahn ........................ H01G 4/30 174/260

FOREIGN PATENT DOCUMENTS

| | | |
|---|---|---|
| JP | 4581194 B2 | 11/2010 |
| JP | 2010267901 A | 11/2010 |
| JP | 2013004569 A | 1/2013 |

* cited by examiner

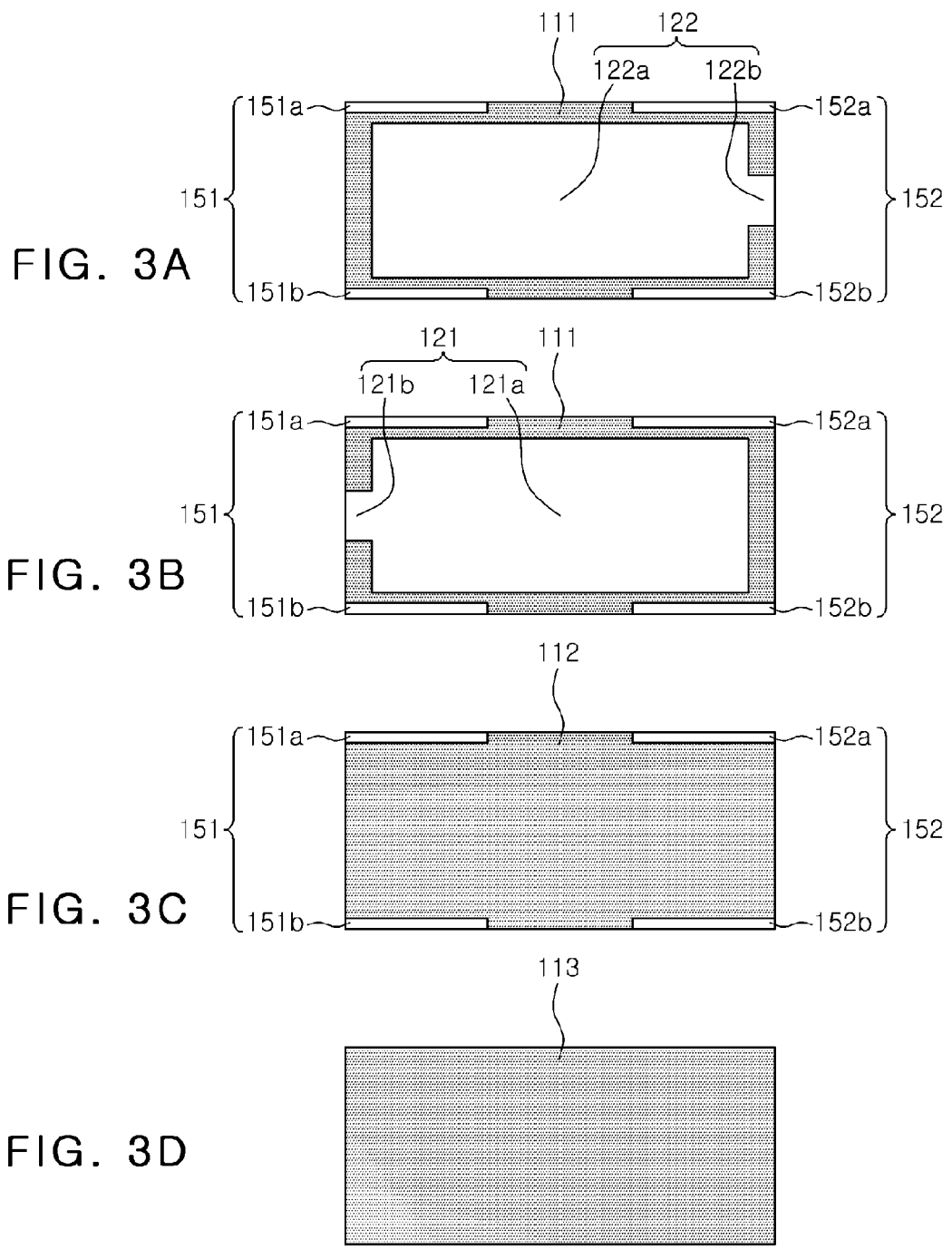

MULTILAYER CERAMIC CAPACITOR

CROSS-REFERENCE TO RELATED APPLICATION

This application claims the benefit of Korean Patent Application No. 10-2013-0128631 filed on Oct. 28, 2013, with the Korean Intellectual Property Office, the disclosure of which is incorporated herein by reference.

BACKGROUND

The present disclosure relates to a multilayer ceramic capacitor.

Examples of electronic component using a ceramic material include a capacitor, an inductor, a piezoelectric material, a varistor, a thermistor, and the like.

Among these ceramic electronic components, a multilayer ceramic capacitor (MLCC) has advantages such as miniaturization, high capacity, and easiness of mounting or the like.

The multilayer ceramic capacitor is a chip shaped condenser mounted on circuit boards of various electronic products such as a display device, for example, a liquid crystal display (LCD), a plasma display panel (PDP), or the like, a computer, a personal digital assistants (PDA), a mobile phone, and the like, to serve to charge electricity or discharge electricity.

Recently, due to an increase in a size of display devices, an increase in a speed of a central processing unit (CPU), or the like, a severe heat generation defect has occurred in the electronic device.

Therefore, in the multilayer ceramic capacitor, the securing of sufficient capacitance and reliability is required even at a high temperature for a stable operation of an integrated circuit (IC) installed in the electronic device.

Recently, in accordance with miniaturization of the multilayer ceramic capacitor and an increase in capacitance thereof, a thickness of dielectric layers is significantly reduced, thereby leading to an inability to secure a lifespan of the multilayer ceramic capacitor and to stabilize quality thereof. Particularly, an electroplating process has a large influence on the quality of the multilayer ceramic capacitor, such that a plating solution or moisture permeates into interfaces of the dielectric layers or internal electrodes through gaps of base electrode layers containing conductive glass to thereby decrease insulating resistance.

In order to solve these defects, a multilayer ceramic capacitor having a structure in which internal electrodes exposed through both end surfaces of a ceramic body and dummy electrodes exposed through one main surface of the ceramic body are formed on dielectric layers, and plating layers are precipitated and grown on exposed portions of the dummy electrodes to form a pair of terminal electrodes on one surface of the capacitor, thereby being mounted on a substrate through a lower surface of the capacitor has been disclosed.

However, in the multilayer ceramic capacitor having the above-mentioned structure, that is, a structure in which base electrode layers formed of conductive glass and connected to exposed portions of the internal electrodes contact the exposed portions of the internal electrodes, the permeation of a plating solution may be caused through interfaces between the dummy electrodes and the base electrode layers at the time of forming the terminal electrodes by growing the plating layers on the dummy electrodes, such that reliability is decreased.

The following Patent Document 1 relates to a multilayer ceramic capacitor and discloses that plating layers are grown on dummy electrodes to form terminal electrodes, but does not disclose a configuration for preventing the permeation of the plating solution through the interfaces between the dummy electrodes and the base electrode layers at the time of forming the terminal electrodes by growing the plating layers on the dummy electrodes.

RELATED ART DOCUMENT (Patent Document 1) Japanese Patent Laid-Open Publication No. 2013-4569

SUMMARY

An aspect of the present disclosure may provide a multilayer ceramic capacitor capable of preventing a plating solution from permeating into a ceramic body through interfaces between dummy electrodes and base electrodes connected to exposed portions of internal electrodes at the time of forming terminal electrodes by growing plating films on the dummy electrodes.

According to an aspect of the present disclosure, a multilayer ceramic capacitor may include: a ceramic body having a plurality of dielectric layers stacked in a width direction thereof and having first and second main surfaces opposing each other in a thickness direction thereof, first and second end surfaces opposing each other in a length direction thereof, and first and second side surfaces opposing each other in the width direction; a plurality of first and second internal electrodes disposed in the ceramic body to be alternately exposed to the first and second end surfaces of the ceramic body, respectively, with the dielectric layers interposed therebetween; a plurality of first dummy electrodes formed on the dielectric layers to be exposed through the first main surface and the first end surface of the ceramic body; a plurality of second dummy electrodes formed on the dielectric layers to be exposed through the first main surface and the second end surface of the ceramic body; first and second external electrodes formed on the first and second end surfaces of the ceramic body, respectively; first and second plating layers formed on the first and second external electrodes, respectively; and first and second terminal electrodes respectively formed on exposed portions of the first and second dummy electrodes, on the first main surface of the ceramic body to be connected to the first and second plating layers, respectively, wherein the first and second external electrodes include inner external electrode layers in a state of non-contact with the first and second dummy electrodes and outer external electrode layers in contact with the first and second dummy electrodes, respectively.

According to another aspect of the present disclosure, a multilayer ceramic capacitor may include: a ceramic body having a plurality of dielectric layers stacked in a width direction thereof and having first and second main surfaces opposing each other in a thickness direction thereof, first and second end surfaces opposing each other in a length direction thereof, and first and second side surfaces opposing each other in the width direction; a plurality of first and second internal electrodes disposed in the ceramic body to be alternately exposed to the first and second end surfaces of the ceramic body, respectively, with the dielectric layers interposed therebetween; a plurality of first dummy electrodes formed on the dielectric layers to be exposed through the first main surface and the first end surface of the ceramic body; a plurality of second dummy electrodes formed on the dielectric layers to be exposed through the first main surface and the second end surface of the ceramic body; first and second base electrode layers formed on the first and second end surfaces of the ceramic body, respectively, to be connected to exposed portions of the first and second internal electrodes, respectively; first and second conductive resin layers covering the first and second base electrode layers formed on the first and second end surfaces of the ceramic body, respectively, and connected to exposed portions of the first and second dummy electrodes, respectively; first and second plating layers covering the first and second conductive resin layers, respectively; and first and second terminal electrodes respectively formed on the exposed portions of the first and second dummy electrodes on the first main surface of the ceramic body to be connected to the first and second plating layers, respectively.

The first dummy electrodes may be further formed on the dielectric layers to be exposed through the second main surface and the first end surface of the ceramic body, and the second dummy electrodes may be further formed on the dielectric layers to be exposed through the second main surface and the second end surface of the ceramic body.

The first and second base electrode layers may be extended from the first and second end surfaces of the ceramic body to portions of the first and second side surfaces thereof, respectively.

According to another aspect of the present disclosure, a multilayer ceramic capacitor may include: a ceramic body having a plurality of dielectric layers stacked in a width direction thereof and having first and second main surfaces opposing each other in a thickness direction thereof, first and second end surfaces opposing each other in a length direction thereof, and first and second side surfaces opposing each other in the width direction; a plurality of first and second internal electrodes disposed in the ceramic body to be alternately exposed to the first and second end surfaces of the ceramic body, respectively, with the dielectric layers interposed therebetween; a plurality of first dummy electrodes formed on the dielectric layers to be exposed through the first main surface of the ceramic body; a plurality of second dummy electrodes formed on the dielectric layers to be exposed through the first main surface of the ceramic body and be spaced apart from the first dummy electrodes in the length direction; first and second base electrode layers formed on the first and second end surfaces of the ceramic body, respectively, to be connected to exposed portions of the first and second internal electrodes, respectively; first and second conductive resin layers covering the first and second base electrode layers formed on the first and second end surfaces of the ceramic body, respectively, and connected to exposed portions of the first and second dummy electrodes, respectively; first and second plating layers covering the first and second conductive resin layers, respectively; and first and second terminal electrodes respectively formed on the exposed portions of the first and second dummy electrodes, on the first main surface of the ceramic body to be connected to the first and second plating layers, respectively.

The first and second base electrode layers may be formed to cover the entirety of the first and second end surfaces of the ceramic body, respectively.

The first and second internal electrodes may include first and second capacitance parts accommodated in the ceramic body and first and second lead parts respectively protruding from central portions of one ends of the first and second capacitance parts to be exposed through the first and second end surfaces of the ceramic body, respectively.

The first and second base electrode layers may be formed using a conductive paste containing copper and glass.

The first and second conductive resin layers may contain one of a thermosetting resin, a conductive filler, and a metal particle.

The first and second plating layers may be formed by sequentially stacking a nickel (Ni) plating layer and a tin (Sn) plating layer on the first and second end surfaces of the ceramic body, respectively.

The first and second terminal electrodes may be formed by growing plating films on the exposed portions of the first and second dummy electrodes, respectively.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A through 3D are plan views showing dielectric layers, first and second internal electrodes, and first and second dummy electrodes of FIG. 1;

DETAILED DESCRIPTION

Figure 1:
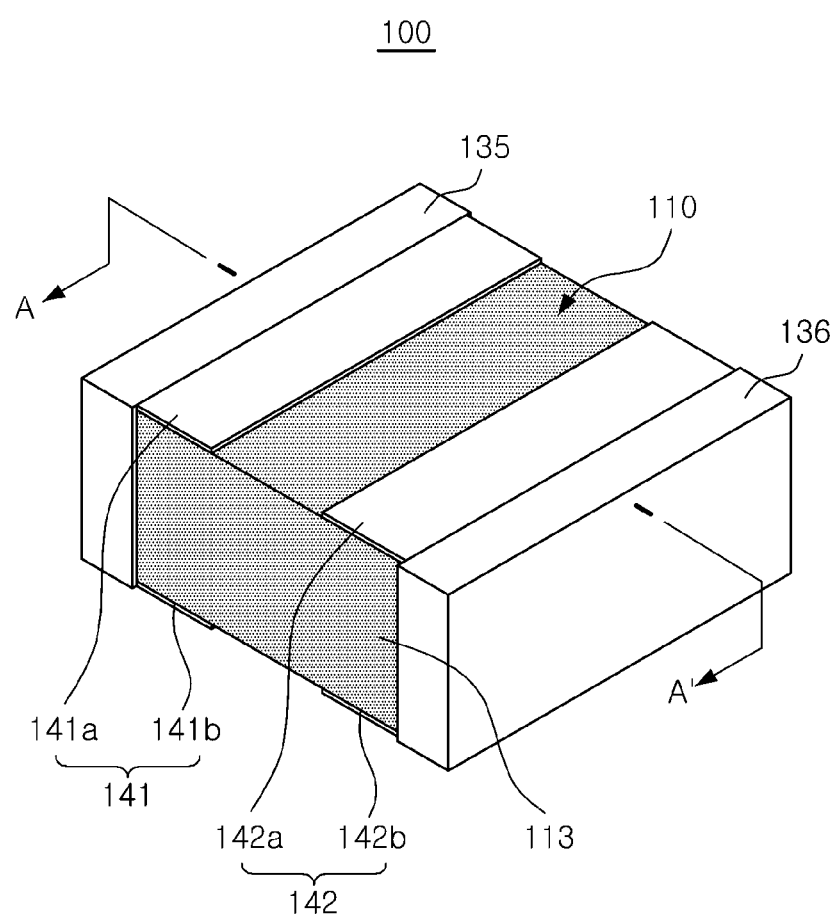
FIG. 1 is a perspective view showing a schematic structure of a multilayer ceramic capacitor according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
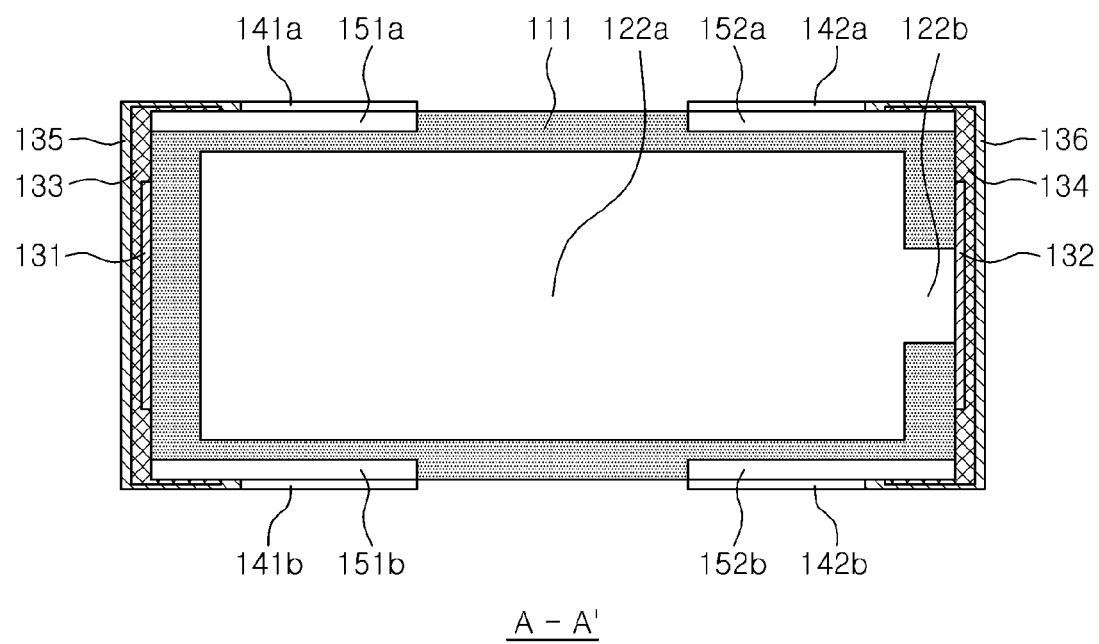
FIG. 2 is a cross-sectional view of line A-A' of FIG. 1.

FIG. 1 is a perspective view showing a schematic structure of a multilayer ceramic capacitor according to an exemplary embodiment of the present disclosure; and FIG. 2 is a cross-sectional view of line A-A' of FIG. 1.

Referring to FIGS. 1 and 2, a multilayer ceramic capacitor according to an exemplary embodiment of the present disclosure may include a ceramic body 110 having a plurality of dielectric layers 111 stacked in a width direction thereof, a plurality of first and second internal electrodes 121 and 122, a plurality of first and second dummy electrodes 151 and 152, first and second external electrodes, first and second plating layers 135 and 136, and first and second terminal electrodes 141 and 142.

Here, the first and second external electrodes may include inner external electrode layers in a state of non-contact with the first and second dummy electrodes 151 and 152 and outer external electrode layers in contact with the first and second dummy electrodes, respectively.

Hereinafter, in an exemplary embodiment of the present disclosure, the inner external electrode will be referred to as a base electrode layer and the outer external electrode layer will be referred to as a conductive resin layer. However, the present disclosure is not limited thereto. That is, both of the inner and outer external electrode layers of the external electrodes according to the present disclosure may be formed as base electrode layers formed of conductive glass. The base electrode layers may serve as buffer electrode layers.

The ceramic body 110 may be formed by stacking the plurality of dielectric layers 111 and then sintering the same, and the dielectric layers 111 adjacent to each other may be integrated such that boundaries therebetween are not apparent.

In addition, the ceramic body 110 may have a hexahedral shape.

In the exemplary embodiment, surfaces of the ceramic body 110, opposing each other in the thickness direction, that is, a direction in which the dielectric layers 111 are stacked, may be defined as first and second main surfaces, end surfaces of the ceramic body 110, connecting the first and second main surfaces to each other and opposing each other in the length direction may be defined as first and second end surfaces, and side surfaces of the ceramic body 110, opposing each other in the width direction may be defined as first and second side surfaces.

The dielectric layers 111 may contain a high-k ceramic material, for example, a barium titanate ($BaTiO_3$) based ceramic powder, or the like. However, the present disclosure is not limited thereto as long as sufficient capacitance may be obtained.

In addition, if necessary, the dielectric layers 111 may further contain various types of ceramic additive such as a transition metal oxide or carbide, a rare earth element, magnesium (Mg), aluminum (Al), or the like, an organic solvent, a plasticizer, a binder, a dispersant, and the like, in addition to the ceramic powder.

Referring to FIGS. 3A and 3B, the first and second internal electrodes 121 and 122, electrodes having different polarities, may be formed and stacked on at least one or more surfaces of ceramic sheets forming the dielectric layers 111, and may be disposed in the ceramic body 110 to be alternately exposed to the first and second end surfaces of the ceramic body 110 with the respective dielectric layers 111 interposed therebetween.

The first and second internal electrodes 121 and 122 may include first and second capacitance parts 121a and 122a, accommodated in the ceramic body 110 and first and second lead parts 121b and 122b, respectively protruding from the central portions of one ends of the first and second capacitance parts 121a and 122a to be exposed through the first and second end surfaces of the ceramic body 110, respectively.

That is, the first and second internal electrodes 121 and 122 may be exposed through the first and second lead parts 121b and 122b, respectively, to secure margin parts between the first and second lead parts 121b and 122b and the first and second dummy electrodes 151 and 152 that are spaced apart from one another by predetermined intervals, thereby further preventing the permeation of a plating solution.

Here, the first and second internal electrodes 121 and 122 may be electrically insulated from each other by the dielectric layers 111 interposed therebetween, and capacitance of the multilayer ceramic capacitor 100 may be in proportion to an area of the first and second capacitance parts 121a and 122a of the first and second internal electrodes 121 and 122 overlapped with each other in a direction in which the dielectric layers 111 are stacked.

In addition, the first and second internal electrodes 121 and 122 may be formed of a conductive material, for example, any one of silver (Ag), lead (Pd), platinum (Pt), nickel (Ni), and copper (Cu) or an alloy thereof. However, the present disclosure is not limited thereto.

Among the first dummy electrodes 151, first dummy electrodes 151a may be formed on the dielectric layers 111 on which the first and second internal electrodes 121 and 122 are formed to be exposed to the first main surface and the first end surface of the ceramic body 110. In addition, first dummy electrodes 151b may be formed on the dielectric layers 111 on which the first and second internal electrodes 121 and 122 are formed to be exposed to the second main surface and the first end surface of the ceramic body 110, such that the first dummy electrodes 151b may be symmetrical to the first dummy electrodes 151a in a vertical direction.

Among the second dummy electrodes 152, second dummy electrodes 152a may be formed on the dielectric layers 111 on which the first and second internal electrodes 121 and 122 are formed to be exposed to the first main surface and the second end surface of the ceramic body 110. In addition, second dummy electrodes 152b may be formed on the dielectric layers 111 on which the first and second internal electrodes 121 and 122 are formed to be exposed to the second main surface and the second end surface of the ceramic body 110, such that the second dummy electrodes 152b may be symmetrical to the second dummy electrodes 152a in the vertical direction.

Referring to FIG. 3C, the first and second dummy electrodes 151 and 152 may be formed on dielectric layers 112 on which the first and second internal electrodes 121 and 122 are not formed, if necessary, and may be stacked in the ceramic body 110.

Meanwhile, the ceramic body 110 may include an active layer contributing to capacitance formation of the capacitor, and cover layers as margin parts.

The active layer may be formed by stacking the plurality of first and second internal electrodes 121 and 122 with the dielectric layers 111 interposed therebetween, in a repeated manner.

Referring to FIG. 3D, the cover layers may be formed of the same material as that of the dielectric layers 111 or 112 and have the same configuration as that of the dielectric layers 111 or 112 except that they have no internal electrodes included therein.

The cover layers may be formed by stacking a single dielectric layer 113 or two or more dielectric layers 113 on each of first and second side surfaces of the active layer in the width direction and may basically serve to prevent damage to the first and second internal electrodes 121 and 122 due to physical and chemical stress.

Figures 4A, 4B:
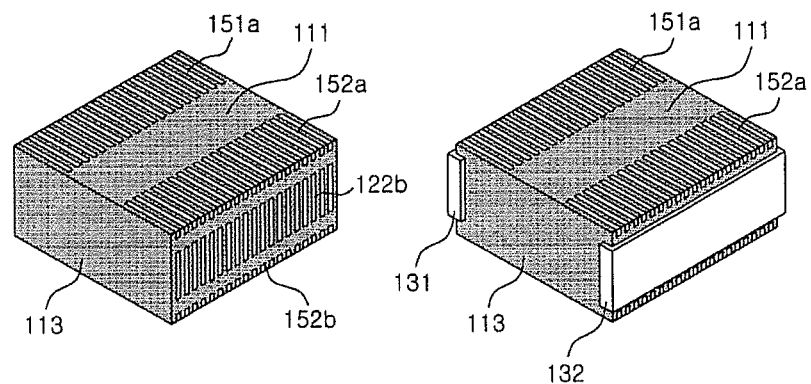
FIGS. 4A through 4D are perspective view showing a process of manufacturing the multilayer ceramic capacitor of FIG. 1.

Referring to FIGS. 4A and 4B, first and second base electrode layers 131 and 132 may be connected to the first and second lead parts 121b and 122b of the respective first and second internal electrodes 121 and 122 that are exposed to the first and second end surfaces of the ceramic body 110 so as not to contact the first and second dummy electrodes 151 and 152, respectively. Therefore, the first and second base electrode layers 131 and 132 may not be connected to the first and second dummy electrodes 151 and 152, respectively, thereby effectively preventing the plating solution from permeating into the ceramic body through interfaces between exposed portions of the first and second dummy electrodes 151 and 152 and the first and second base electrode layers 131 and 132 at the time of growing plating films on the first and second dummy electrodes 151 and 152.

Here, the first and second base electrode layers 131 and 132 may be extended from the first and second end surfaces of the ceramic body 110 to portions of the first and second side surfaces thereof, respectively.

In addition, the first and second base electrode layers 131 and 132 may be formed by applying a conductive paste containing copper and glass and performing a heat treatment thereon.

Figures 4C, 4D:
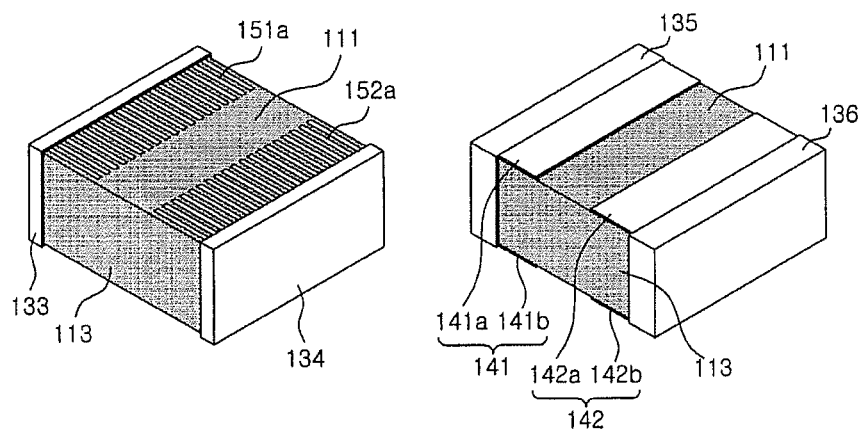

Referring to FIG. 4C, first and second conductive resin layers 133 and 134 may be formed on the respective first and second end surfaces of the ceramic body 110 while covering the respective first and second base electrode layers 131 and 132 to be connected to the exposed portions of the first and second dummy electrodes 151 and 152, respectively.

In addition, the first and second conductive resin layers 133 and 134 may be formed by applying a conductive epoxy to the respective first and second end surfaces and then hardening the conductive epoxy. In this case, the first and second conductive resin layers 133 and 134 may contain one of a thermosetting resin, a conductive filler, and a metal particle, if necessary. Therefore, the permeation of the plating solution into the exposed portions of the first and second internal electrodes 121 and 122 may be further effectively prevented by a two-layer structure including the first and second base electrode layers 131 and 132 and the first and second conductive resin layers 133 and 134. In addition, the first and second conductive resin layers 133 and 134 may cover corner portions of the ceramic body 110 to thereby further effectively protect the ceramic body 110 from mechanical stress or impacts.

Referring to FIG. 4D, the first and second plating layer 135 and 136 may cover the first and second conductive resin layers 133 and 134 formed on the first and second end surfaces of the ceramic body 110, respectively.

Here, the first and second plating layers 135 and 136 may be formed by sequentially stacking a nickel (Ni) plating layer and a tin (Sn) plating layer on the first and second end surfaces of the ceramic body 110, respectively.

The first and second terminal electrodes 141 and 142 may be respectively formed on the exposed portions of the first and second dummy electrodes 151 and 152, on the first or second main surface of the ceramic body 110 to be in contact with and connected to the first and second plating layers 135 and 136, respectively.

Here, the first and second terminal electrodes 141 and 142 may be formed by growing plating films on the exposed portions of the first and second dummy electrodes 151 and 152, respectively.

That is, the first and second dummy electrodes 151 and 152 and end portions of the first and second conductive resin layers 134 and 134 may be electrically bonded to each other, respectively, at the time of performing electroplating, such that they easily contact a media and current flows from the first and second conductive resin layers 133 and 134 having low resistance to the first and second dummy electrodes 151 and 152 to allow the plating layers of the first and second dummy electrodes 151 and 152 to be more easily precipitated.

In addition, the first and second terminal electrodes 141 and 142 having a uniform thickness may be formed, such that a time required for performing the electroplating may also be decreased.

Figure 5:
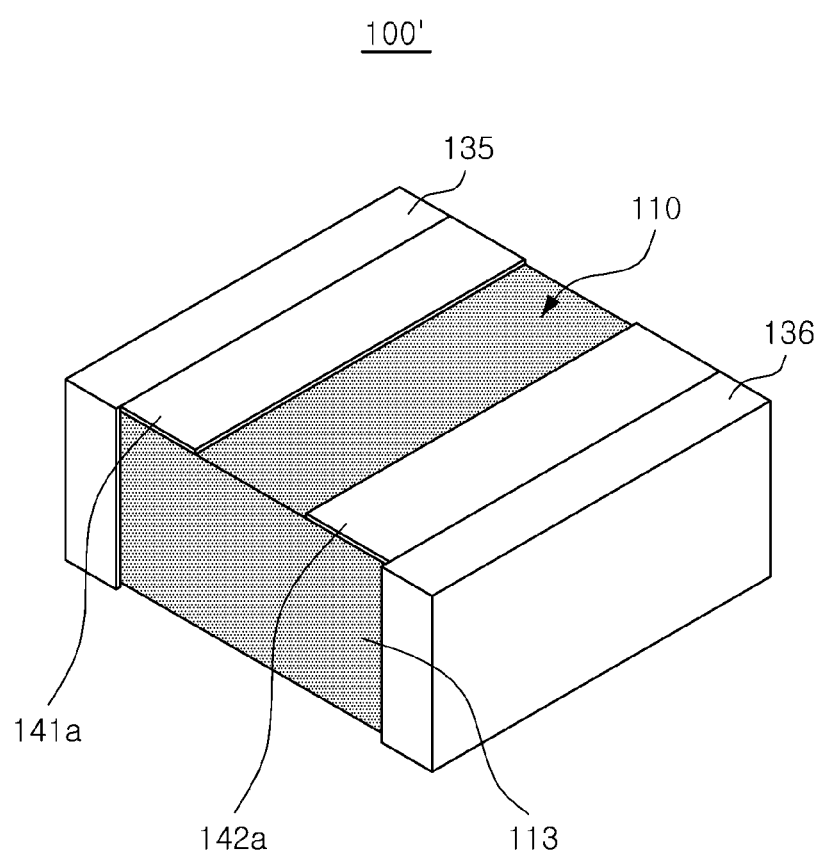
FIG. 5 is a perspective view showing a schematic structure of a multilayer ceramic capacitor according to another exemplary embodiment of the present disclosure.
Figure 6A:
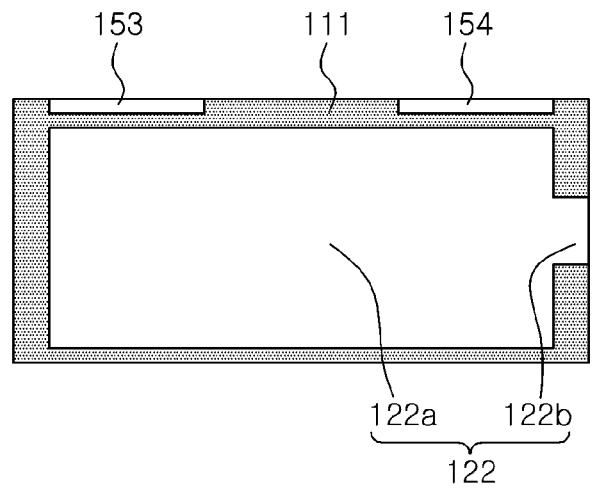
FIGS. 6A and 6B are plan views showing dielectric layers, first and second internal electrodes, and first and second dummy electrodes of FIG. 5.
Figure 6B:
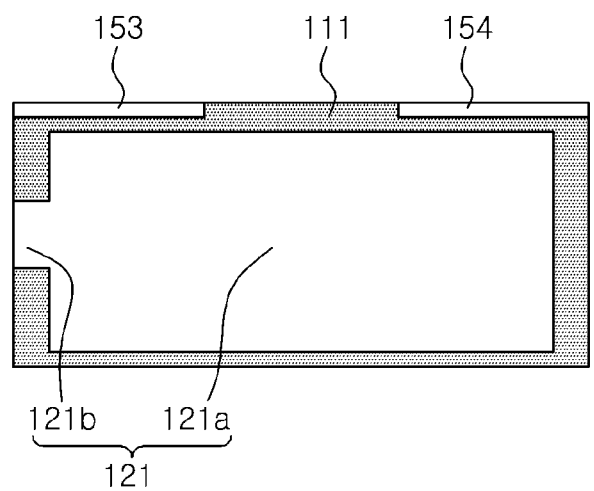
Figure 7A:
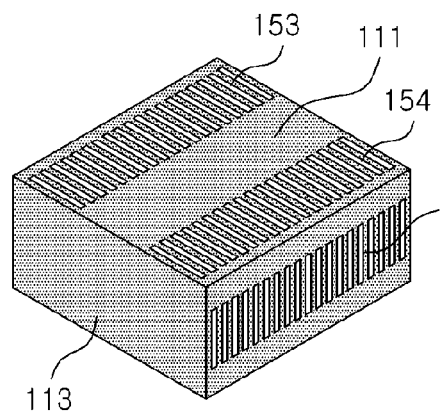
FIGS. 7A through 7D are perspective view showing a process of manufacturing the multilayer ceramic capacitor of FIG. 5.
Figure 7B:
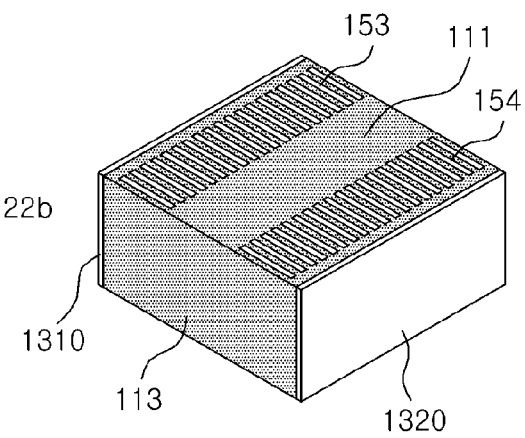
Figure 7C:
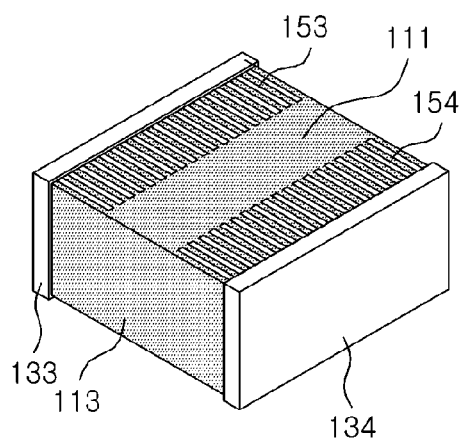
Figure 7D:
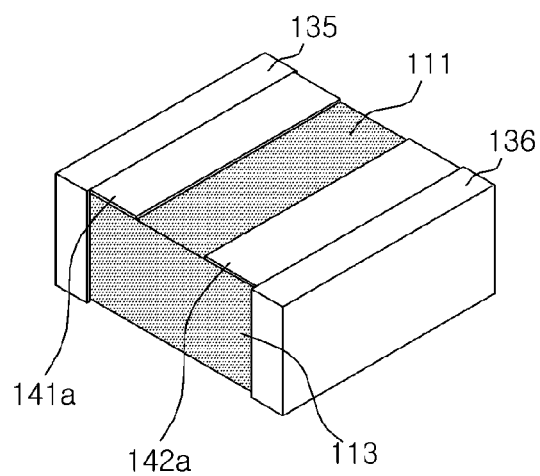

FIG. 5 is a perspective view showing a schematic structure of a multilayer ceramic capacitor according to another exemplary embodiment of the present disclosure; FIGS. 6A and 6B are plan views showing dielectric layers, first and second internal electrodes, and first and second dummy electrodes of FIG. 5; and FIGS. 7A through 7D are perspective view showing a process of manufacturing the multilayer ceramic capacitor of FIG. 5.

Referring to FIGS. 5 through 7, in a multilayer ceramic capacitor 100' according to another exemplary embodiment of the present disclosure, first dummy electrodes 153 may be formed on the dielectric layers 111 to be exposed through only the first main surface of the ceramic body 110, and second dummy electrodes 154 may be formed on the dielectric layers 111 to be exposed through only the first main surface of the ceramic body 110 and to be spaced apart from the first dummy electrodes 153 in the length direction.

In addition, first and second base electrode layers 1310 and 1320 may be formed on the first and second end surfaces of the ceramic body 110 to be connected to the lead parts 121b and 122b of the first and second internal electrodes 121 and 122 that are exposed to the end surfaces, respectively, and may be formed to cover the entirety of the first and second end surfaces of the ceramic body 110.

Here, since the ceramic body 110, the cover layer 113, the first and second internal electrodes 121 and 122, the first and second conductive resin layers 133 and 134, and the first and second plating layers 135 and 136 have the same structures as those of the cover layer 113, the first and second internal electrodes 121 and 122, the first and second conductive resin layers 133 and 134, and the first and second plating layers 135 and 136 of the multilayer ceramic capacitor according to an exemplary embodiment of the present disclosure described above, a detailed description thereof will be omitted in order to avoid an overlapped description.

Figure 8:
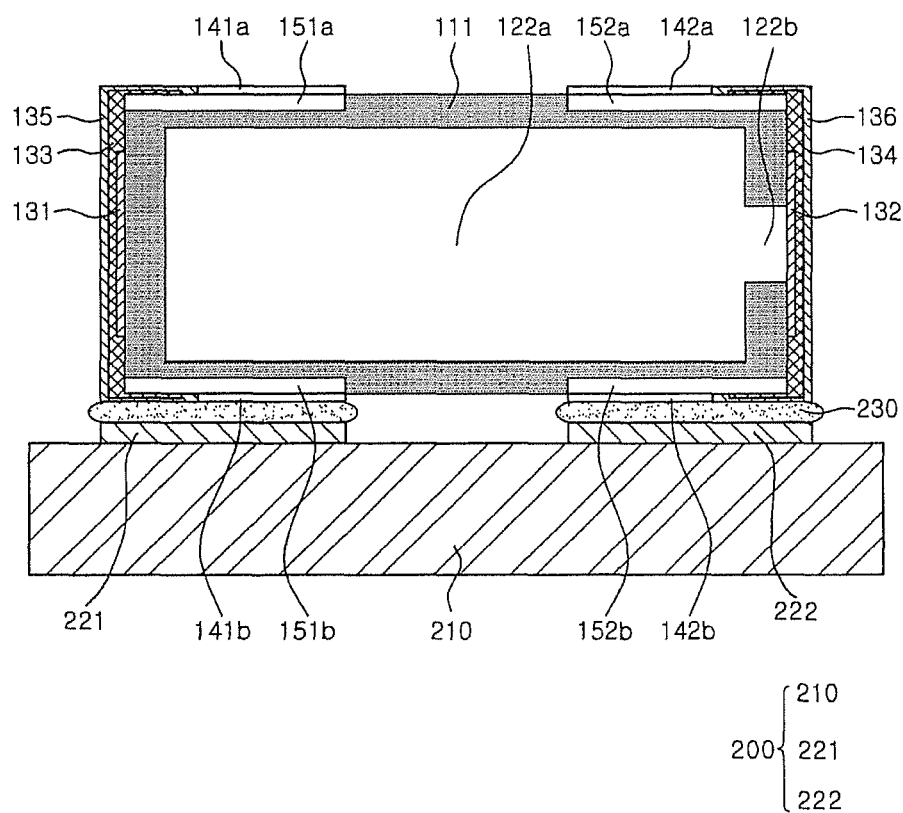
FIG. 8 is a cross-sectional view showing a form in which the multilayer ceramic capacitor of FIG. 1 is mounted on a printed circuit board.

FIG. 8 is a cross-sectional view showing a form in which the multilayer ceramic capacitor of FIG. 1 is mounted on a printed circuit board.

Referring to FIG. 8, a board 200 having the multilayer ceramic capacitor 100 mounted thereon according to an exemplary embodiment may include a printed circuit board 210 having the multilayer ceramic capacitor 100 or 100' horizontally mounted thereon and first and second electrode pads 221 and 222 formed on an upper surface of the printed circuit board 210 to be spaced apart from each other.

Here, the multilayer ceramic capacitor 100 or 100' may be electrically connected to the printed circuit board 210 by soldering parts 230 while the first and second terminal electrodes 141b and 142b thereof are positioned on the first and second electrode pads 211 and 222 to contact the first and second electrode pads 221 and 222, respectively.

In this case, sufficient adhesion strength between the multilayer ceramic capacitor and the first and second electrode pads 221 and 221 may be secured by the first and second dummy electrodes 151 and 152 and the first and second terminal electrodes 141 and 142 formed by the plating process, such that an amount of the soldering part 230 may be decreased. As a result, a mounting area of the multilayer ceramic capacitor 100 to be mounted on the printed circuit board 210 may be decreased.

As set forth above, according to exemplary embodiments of the present disclosure, since the first and second base electrode layers do not contact the first and second dummy electrodes, respectively, the permeation of the plating solution into the ceramic body though the interfaces between the first and second dummy electrodes and the first and second base electrode layers at the time of forming the first and second terminal electrodes by growing the plating films on the first and second dummy electrodes may be prevented, thereby improving reliability.

In addition, since the first and second conductive resin layers are formed to cover the first and second base electrode layers, respectively, the permeation of the plating solution into the ceramic body though the interfaces between the first and second dummy electrodes and the first and second base electrode layers at the time of forming the first and second terminal electrodes by growing the plating films on the first and second dummy electrodes may be further prevented, thereby further improving the reliability.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
   a ceramic body having a plurality of dielectric layers stacked in a width direction thereof and having first and second main surfaces opposing each other in a thickness direction thereof, first and second end surfaces opposing each other in a length direction thereof, and first and second side surfaces opposing each other in the width direction;
   a plurality of first and second internal electrodes disposed in the ceramic body to be alternately exposed to the first and second end surfaces of the ceramic body, respectively, with the dielectric layers interposed therebetween;
   a plurality of first dummy electrodes formed on the dielectric layers to be exposed through the first main surface and the first end surface of the ceramic body;
   a plurality of second dummy electrodes formed on the dielectric layers to be exposed through the first main surface and the second end surface of the ceramic body;
   first and second external electrodes formed on the first and second end surfaces of the ceramic body, respectively;
   first and second plating layers formed on the first and second external electrodes, respectively; and
   first and second terminal electrodes respectively formed on exposed portions of the first and second dummy electrodes, on the first main surface of the ceramic body to be connected to the first and second plating layers, respectively,
   wherein the first and second external electrodes include inner external electrode layers in a state of non-contact with the first and second dummy electrodes and outer external electrode layers in contact with the first and second dummy electrodes, respectively.

2. A multilayer ceramic capacitor comprising:
   a ceramic body having a plurality of dielectric layers stacked in a width direction thereof and having first and second main surfaces opposing each other in a thickness direction thereof, first and second end surfaces opposing each other in a length direction thereof, and first and second side surfaces opposing each other in the width direction;
   a plurality of first and second internal electrodes disposed in the ceramic body to be alternately exposed to the first and second end surfaces of the ceramic body, respectively, with the dielectric layers interposed therebetween;
   a plurality of first dummy electrodes formed on the dielectric layers to be exposed through the first main surface and the first end surface of the ceramic body;
   a plurality of second dummy electrodes formed on the dielectric layers to be exposed through the first main surface and the second end surface of the ceramic body;
   first and second base electrode layers formed on the first and second end surfaces of the ceramic body, respectively, to be connected to exposed portions of the first and second internal electrodes, respectively;
   first and second conductive resin layers covering the first and second base electrode layers formed on the first and second end surfaces of the ceramic body, respectively, and connected to exposed portions of the first and second dummy electrodes, respectively;
   first and second plating layers covering the first and second conductive resin layers, respectively; and
   first and second terminal electrodes respectively formed on the exposed portions of the first and second dummy electrodes on the first main surface of the ceramic body to be connected to the first and second plating layers, respectively.

3. The multilayer ceramic capacitor of claim 1, wherein the first and second internal electrodes include first and second capacitance parts accommodated in the ceramic body and first and second lead parts respectively protruding from central portions of one ends of the first and second capacitance parts to be exposed through the first and second end surfaces of the ceramic body, respectively.

4. The multilayer ceramic capacitor of claim 1, wherein the first dummy electrodes are further formed on the dielectric layers to be exposed through the second main surface and the first end surface of the ceramic body, and the second dummy electrodes are further formed on the dielectric layers to be exposed through the second main surface and the second end surface of the ceramic body.

5. The multilayer ceramic capacitor of claim 1, wherein the first and second base electrode layers are extended from the first and second end surfaces of the ceramic body to portions of the first and second side surfaces thereof, respectively.

6. The multilayer ceramic capacitor of claim 1, wherein the first and second base electrode layers are formed using a conductive paste containing copper and glass.

7. The multilayer ceramic capacitor of claim 1, wherein the first and second conductive resin layers contain one of a thermosetting resin, a conductive filler, and a metal particle.

8. The multilayer ceramic capacitor of claim 1, wherein the first and second plating layers are formed by sequentially stacking a nickel (Ni) plating layer and a tin (Sn) plating layer on the first and second end surfaces of the ceramic body, respectively.

9. The multilayer ceramic capacitor of claim 1, wherein the first and second terminal electrodes are formed by growing plating films on the exposed portions of the first and second dummy electrodes, respectively.

10. A multilayer ceramic capacitor comprising:
    a ceramic body having a plurality of dielectric layers stacked in a width direction thereof and having first and second main surfaces opposing each other in a thickness direction thereof, first and second end surfaces opposing each other in a length direction thereof, and first and second side surfaces opposing each other in the width direction;

a plurality of first and second internal electrodes disposed in the ceramic body to be alternately exposed to the first and second end surfaces of the ceramic body, respectively, with the dielectric layers interposed therebetween;

a plurality of first dummy electrodes formed on the dielectric layers to be exposed through the first main surface of the ceramic body;

a plurality of second dummy electrodes formed on the dielectric layers to be exposed through the first main surface of the ceramic body and be spaced apart from the first dummy electrodes in the length direction;

first and second base electrode layers formed on the first and second end surfaces of the ceramic body, respectively, to be connected to exposed portions of the first and second internal electrodes, respectively;

first and second conductive resin layers covering the first and second base electrode layers formed on the first and second end surfaces of the ceramic body, respectively, and connected to exposed portions of the first and second dummy electrodes, respectively;

first and second plating layers covering the first and second conductive resin layers, respectively; and first and second terminal electrodes respectively formed on the exposed portions of the first and second dummy electrodes, on the first main surface of the ceramic body to be connected to the first and second plating layers, respectively.

11. The multilayer ceramic capacitor of claim 10, wherein the first and second internal electrodes include first and second capacitance parts accommodated in the ceramic body and first and second lead parts respectively protruding from central portions of one ends of the first and second capacitance parts to be exposed through the first and second end surfaces of the ceramic body, respectively.

12. The multilayer ceramic capacitor of claim 10, wherein the first and second base electrode layers are formed to cover the entirety of the first and second end surfaces of the ceramic body, respectively.

13. The multilayer ceramic capacitor of claim 10, wherein the first and second base electrode layers are formed using a conductive paste containing copper and glass.

14. The multilayer ceramic capacitor of claim 10, wherein the first and second conductive resin layers contain one of a thermosetting resin, a conductive filler, and a metal particle.

15. The multilayer ceramic capacitor of claim 10, wherein the first and second plating layers are formed by sequentially stacking a nickel (Ni) plating layer and a tin (Sn) plating layer on the first and second end surfaces of the ceramic body, respectively.

16. The multilayer ceramic capacitor of claim 10, wherein the first and second terminal electrodes are formed by growing plating films on the exposed portions of the first and second dummy electrodes, respectively.

17. A board having a multilayer ceramic capacitor mounted thereon, comprising:

the multilayer ceramic capacitor of claim 1; and a printed circuit board including first and second electrode pads on which the first and second terminal electrodes of the multilayer ceramic capacitor are mounted, respectively.

18. A board having a multilayer ceramic capacitor mounted thereon, comprising:

the multilayer ceramic capacitor of claim 2; and a printed circuit board including first and second electrode pads on which the first and second terminal electrodes of the multilayer ceramic capacitor are mounted, respectively.

19. A board having a multilayer ceramic capacitor mounted thereon, comprising:

the multilayer ceramic capacitor of claim 3; and a printed circuit board including first and second electrode pads on which the first and second terminal electrodes of the multilayer ceramic capacitor are mounted, respectively.

20. A board having a multilayer ceramic capacitor mounted thereon, comprising:

the multilayer ceramic capacitor of claim 4; and a printed circuit board including first and second electrode pads on which the first and second terminal electrodes of the multilayer ceramic capacitor are mounted, respectively.

21. A board having a multilayer ceramic capacitor mounted thereon, comprising:

the multilayer ceramic capacitor of claim 5; and a printed circuit board including first and second electrode pads on which the first and second terminal electrodes of the multilayer ceramic capacitor are mounted, respectively.

22. A board having a multilayer ceramic capacitor mounted thereon, comprising:

the multilayer ceramic capacitor of claim 6; and a printed circuit board including first and second electrode pads on which the first and second terminal electrodes of the multilayer ceramic capacitor are mounted, respectively.

23. A board having a multilayer ceramic capacitor mounted thereon, comprising:

the multilayer ceramic capacitor of claim 7; and a printed circuit board including first and second electrode pads on which the first and second terminal electrodes of the multilayer ceramic capacitor are mounted, respectively.

24. A board having a multilayer ceramic capacitor mounted thereon, comprising:

the multilayer ceramic capacitor of claim 8; and a printed circuit board including first and second electrode pads on which the first and second terminal electrodes of the multilayer ceramic capacitor are mounted, respectively.

25. A board having a multilayer ceramic capacitor mounted thereon, comprising:

the multilayer ceramic capacitor of claim 9; and a printed circuit board including first and second electrode pads on which the first and second terminal electrodes of the multilayer ceramic capacitor are mounted, respectively.

26. A board having a multilayer ceramic capacitor mounted thereon, comprising:

the multilayer ceramic capacitor of claim 10; and a printed circuit board including first and second electrode pads on which the first and second terminal electrodes of the multilayer ceramic capacitor are mounted, respectively.

27. A board having a multilayer ceramic capacitor mounted thereon, comprising:

the multilayer ceramic capacitor of claim 11; and a printed circuit board including first and second electrode pads on which the first and second terminal electrodes of the multilayer ceramic capacitor are mounted, respectively.

28. A board having a multilayer ceramic capacitor mounted thereon, comprising:
   the multilayer ceramic capacitor of claim 12; and
   a printed circuit board including first and second electrode pads on which the first and second terminal electrodes of the multilayer ceramic capacitor are mounted, respectively.

29. A board having a multilayer ceramic capacitor mounted thereon, comprising:
   the multilayer ceramic capacitor of claim 13; and
   a printed circuit board including first and second electrode pads on which the first and second terminal electrodes of the multilayer ceramic capacitor are mounted, respectively.

30. A board having a multilayer ceramic capacitor mounted thereon, comprising:
   the multilayer ceramic capacitor of claim 14; and
   a printed circuit board including first and second electrode pads on which the first and second terminal electrodes of the multilayer ceramic capacitor are mounted, respectively.

31. A board having a multilayer ceramic capacitor mounted thereon, comprising:
   the multilayer ceramic capacitor of claim 15; and
   a printed circuit board including first and second electrode pads on which the first and second terminal electrodes of the multilayer ceramic capacitor are mounted, respectively.

32. A board having a multilayer ceramic capacitor mounted thereon, comprising:
   the multilayer ceramic capacitor of claim 16; and
   a printed circuit board including first and second electrode pads on which the first and second terminal electrodes of the multilayer ceramic capacitor are mounted, respectively.

* * * * *